United States Patent
Nagawa

(10) Patent No.: US 9,773,939 B2
(45) Date of Patent: Sep. 26, 2017

(54) LIGHT EMITTING DEVICE AND PROJECTOR

(71) Applicant: Seiko Epson Corporation, Tokyo (JP)

(72) Inventor: Michifumi Nagawa, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/230,841

(22) Filed: Aug. 8, 2016

(65) Prior Publication Data

US 2017/0047476 A1  Feb. 16, 2017

(30) Foreign Application Priority Data

Aug. 11, 2015  (JP) ................................ 2015-158760

(51) Int. Cl.
*H01L 33/00* (2010.01)
*G03B 21/20* (2006.01)

(52) U.S. Cl.
CPC ...... *H01L 33/0045* (2013.01); *G03B 21/2033* (2013.01)

(58) Field of Classification Search
CPC . G03B 21/2033; G03B 21/2066; H01L 33/08; H01L 33/20; H01L 33/38; H01L 33/44; H01L 33/0045; H01L 33/60; G02B 6/036; G02B 6/0096; G02B 6/4298
See application file for complete search history.

(56) References Cited

U.S. PATENT DOCUMENTS

| 5,198,686 | A | * | 3/1993 | Yoshimura | H01L 33/0062 257/13 |
| 2011/0298006 | A1 | | 12/2011 | Hagino et al. | |
| 2013/0292723 | A1 | | 11/2013 | Ohno | |
| 2015/0062541 | A1 | * | 3/2015 | Mochizuki | G03B 21/2033 353/38 |
| 2015/0295126 | A1 | | 10/2015 | Suga et al. | |

FOREIGN PATENT DOCUMENTS

| JP | 2011-253932 A | 12/2011 |
| JP | 2012-043950 A | 3/2012 |
| JP | 2014-112667 A | 6/2014 |

\* cited by examiner

*Primary Examiner* — Sultan Chowdhury
(74) *Attorney, Agent, or Firm* — Harness, Dickey & Pierce, P.L.C.

(57) ABSTRACT

A light emitting device includes a laminated body having an active layer constituting a light waveguide, and first and second clad layers, and first and second electrodes. The light waveguide has first and second light emission surfaces from which light is emitted. The laminated body has a connection area connected to the second electrode. A width of the connection area is smallest at a central position where distances to the first and second light emission surfaces are equal, and increases toward end portion sides in an extending direction of the light waveguide. An outer edge of the connection area is provided with a first portion on the first light emission surface side, a second portion on the second light emission surface side, and third and fourth portions connecting the first and second portions. The third and fourth portions are smooth when viewed from the stacking direction.

12 Claims, 8 Drawing Sheets

LIGHT EMITTING DEVICE AND PROJECTOR

BACKGROUND

1. Technical Field

The present invention relates to a light emitting device and a projector.

2. Related Art

A semiconductor light emitting device such as a semiconductor laser or a super luminescent diode (hereinafter, referred to as an "SLD") is used as, for example, a light source of a projector. The SLD is a semiconductor light emitting device which has an incoherent property in the same manner as a normal light emitting diode, exhibits a wide-band spectral shape, and can generate an output of several hundreds of mW with a single element in the same manner as the semiconductor laser in terms of light output characteristics.

For example, JP-A-2012-43950 discloses an SLD having a waveguide which is tilted in a stripe shape.

Light is exponentially amplified toward a light emission surface which emits the light in a light waveguide of the above-described SLD. For this reason, there is a case where gain saturation may occur due to the number of carriers converted into light becoming insufficient in the vicinity of the light emission surface, and thus the output of the SLD may be reduced.

SUMMARY

An advantage of some aspects of the invention is to provide a light emitting device which can achieve high output by reducing gain saturation. Another advantage of some aspects of the invention is to provide a projector including the light emitting device.

A light emitting device according to an aspect of the invention includes a laminated body that has an active layer which can generate light with a current injected thereinto, and a first clad layer and a second clad layer interposing the active layer therebetween; and a first electrode and a second electrode that inject a current into the active layer. The active layer constitutes a light waveguide through which light is guided. The light waveguide has a first light emission surface and a second light emission surface from which light is emitted. The laminated body has a connection area connected to the second electrode. A width of the connection area is smallest at a central position where distances to the first light emission surface and the second light emission surface are the same as each other and increases toward end portion sides in an extending direction of the light waveguide, when viewed from a stacking direction of the active layer and the first clad layer. An outer edge of the connection area, when viewed from the stacking direction, is provided with a first portion serving as an end portion on the first light emission surface side; a second portion serving as an end portion on the second light emission surface side; a third portion connecting one end of the first portion to one end of the second portion; and a fourth portion connecting the other end of the first portion to the other end of the second portion. The third portion and the fourth portion are smooth when viewed from the stacking direction.

In the light emitting device, the current amount per unit length of the light waveguide overlapping the connection area can be increased toward the end portion sides of the light waveguide in the extending direction from the central position when viewed from the stacking direction. Therefore, in the light emitting device, it is possible to reduce the gain saturation and thus to achieve high output.

In the light emitting device according to the aspect of the invention, when viewed from the stacking direction, the width of the connection area may increase toward the end portion sides from the central position in proportion to an exponential function.

In the light emitting device with this configuration, the current amount per unit length can be changed in accordance with light being exponentially magnified in the extending direction of the light waveguide. Therefore, in the light emitting device, it is possible to efficiently achieve high output.

In the light emitting device according to the aspect of the invention, the light waveguide may extend in a tilted direction with respect to a normal line of the first light emission surface and a normal line of the second light emission surface.

In the light emitting device with this configuration, a direct resonator is not formed, and thus it is possible to prevent laser oscillation of light generated in the light waveguide. As a result, it is possible to reduce speckle noise in the light emitting device.

In the light emitting device according to the aspect of the invention, the second clad layer may have a ridge portion thicker than other portions of the second clad layer.

In the light emitting device with this configuration, a refractive index difference is provided between a area in which the ridge portion is formed and a area in which the ridge portion is not formed, and thus light can be efficiently confined therebetween.

In the light emitting device according to the aspect of the invention, the laminated body may have a contact layer provided between the second clad layer and the second electrode, and the contact layer may be connected to the second electrode.

In the light emitting device with this configuration, it is possible to reduce contact resistance between the laminated body and the second electrode.

In the light emitting device according to the aspect of the invention, the light waveguide may be arranged in a plurality.

In the light emitting device with this configuration, it is possible to achieve high output.

A projector according to another aspect of the invention includes the light emitting device according to the aspect of the invention; a light modulation device that modulates light emitted from the light emitting device according to image information; and a projection device that projects an image formed by the light modulation device.

The projector includes the light emitting device according to the aspect of the invention and can thus achieve high luminance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to improperly limit the content of the invention disclosed in the appended claims. It cannot be said that all constituent elements described below are essential constituent elements of the invention.

1. Light Emitting Device

Figure 1:
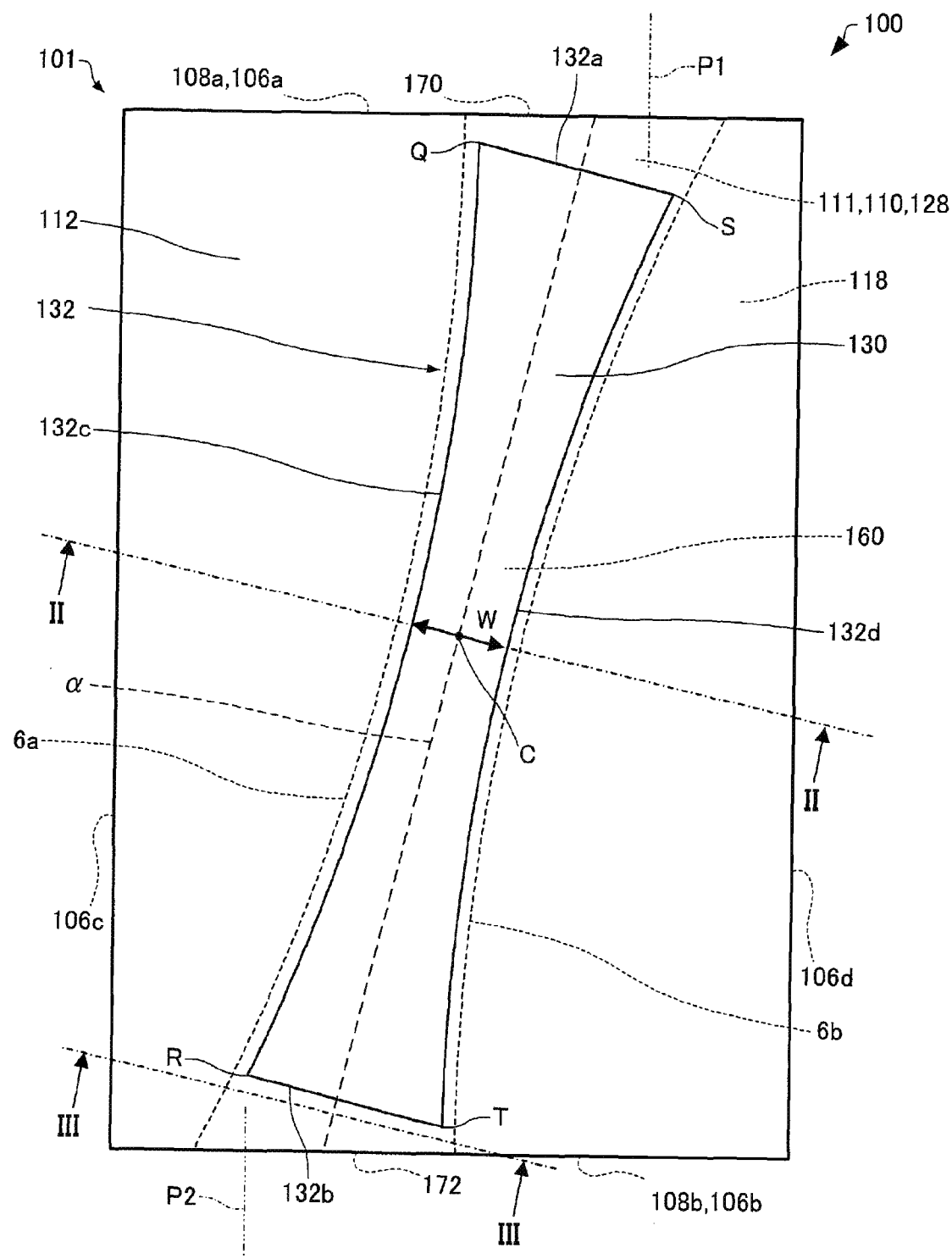
FIG. 1 is a plan view schematically illustrating a light emitting device according to the present embodiment.
Figure 2:
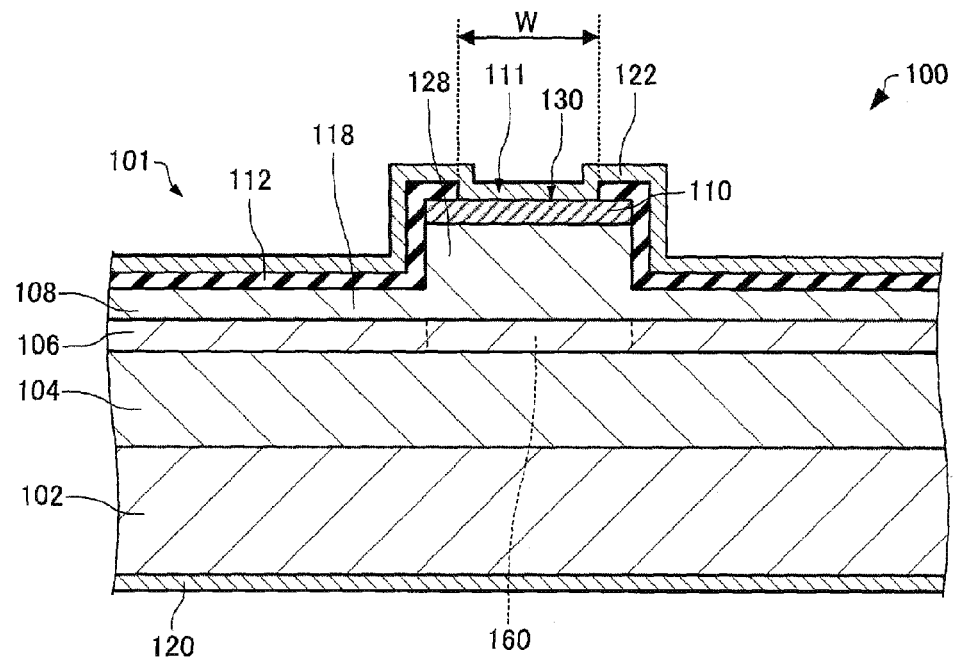
FIG. 2 is a sectional view schematically illustrating the light emitting device according to the present embodiment.
Figure 3:
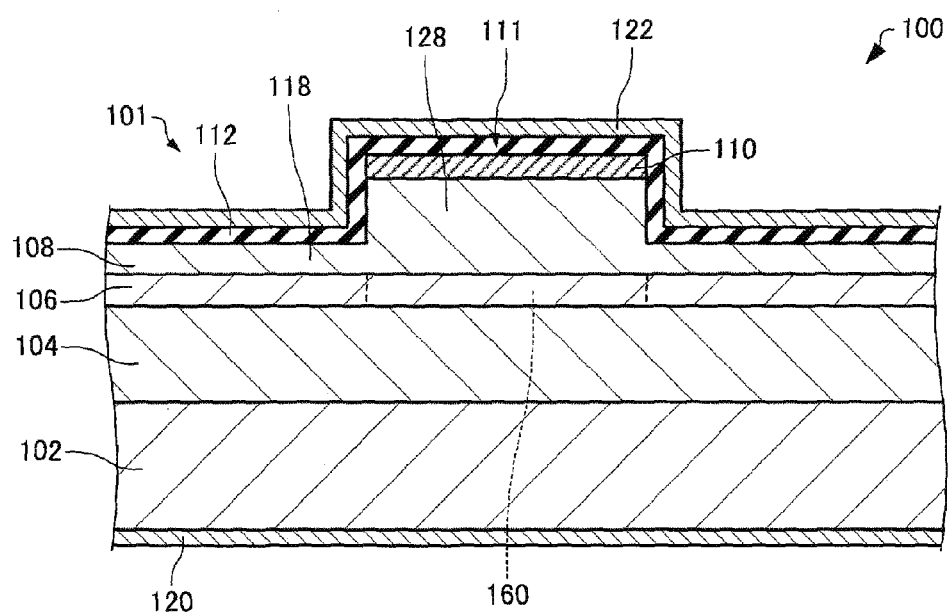
FIG. 3 is a sectional view schematically illustrating the light emitting device according to the present embodiment.

First, a description will be made of a light emitting device according to a first embodiment with reference to the drawings. FIG. 1 is a plan view schematically illustrating a light emitting device 100 according to the first embodiment. FIG. 2 is a sectional view taken along the line II-II of FIG. 1 and schematically illustrates the light emitting device 100 according to the first embodiment. FIG. 3 is a sectional view taken along the line III-III of FIG. 1 and schematically illustrates the light emitting device 100 according to the first embodiment.

The light emitting device 100 includes, as illustrated in FIGS. 1 to 3, a laminated body 101, an insulating layer 112, a first electrode 120, and a second electrode 122. The laminated body 101 has a substrate 102, a first clad layer 104, an active layer 106, a second clad layer 108, and a contact layer 110. For convenience, FIG. 1 does not illustrate the second electrode 122.

The substrate 102 is, for example, a first conductivity type (for example, an n-type) GaAs substrate.

The first clad layer 104 is provided on the substrate 102. The first clad layer 104 is, for example, an n-type InGaAlP layer. Although not illustrated, a buffer layer may be formed between the substrate 102 and the first clad layer 104. The buffer layer is, for example, an n-type GaAs layer, AlGaAs layer, or InGaP layer. The buffer layer can improve crystal quality of a layer formed thereon.

The active layer 106 is provided on the first clad layer 104. The active layer 106 has, for example, a multiple quantum well (MQW) structure in which three quantum well structures each having an InGaP well layer and an InGaAlP barrier layer overlap each other.

As illustrated in FIG. 1, the active layer 106 has a first side surface 106a, a second side surface 106b, a third side surface 106c, and a fourth side surface 106d. The side surfaces 106a and 106b are surfaces (parallel surfaces in the illustrated example) which are directed in directions opposite to each other. The side surfaces 106c and 106d are surfaces (parallel surfaces in the illustrated example) which are directed in directions opposite to each other, and are surfaces which are connected to the side surfaces 106a and 106b. The side surfaces 106a, 106b, 106c and 106d are surfaces which are not in planar contact with the clad layers 104 and 108. The side surfaces 106a and 106b may be cleavage surfaces which are formed through cleavage.

The active layer 106 is a layer into which a current is injected and which can generate light. The active layer 106 constitutes a light waveguide 160 through which light is guided. Light guided through the light waveguide 160 may receive a gain in the light waveguide 160.

The light waveguide 160 extends from the first side surface 106a to the second side surface 106b when viewed from the stacking direction of the active layer 106 and the first clad layer 104 (hereinafter, referred to as "in a plan view"). The light waveguide 160 has a first light emission surface 170 and a second light emission surface 172 which allows light to be emitted. The first light emission surface 170 is a connection portion with the first side surface 106a of the light waveguide 160. The second light emission surface 172 is a connection portion with the second side surface 106b of the light waveguide 160. The light waveguide 160 extends in a tilted direction with respect to a normal line P1 of the first light emission surface 170 and a normal line P2 of the second light emission surface 172. In the illustrated example, a central line α of the light waveguide 160 extends in a tilted direction with respect to the normal lines P1 and P2. The central line α is a virtual straight line which passes through the center of the first light emission surface 170 and the center of the second light emission surface 172.

The light waveguide 160 includes a central position C whose distances to the first light emission surface 170 and the second light emission surface 172 are the same as each other. In the example illustrated in FIG. 1, the central position C is a point on the central line α whose distances to the light emission surfaces 170 and 172 are the same as each other. Boundaries 6a and 6b (side surfaces of a pillar shape portion 111 which will be described later) connecting the first light emission surface 170 of the light waveguide 160 to the second light emission surface 172 thereof are curved in a plan view. The boundary 6a is a boundary on the third side surface 106c side of the active layer 106, and the boundary 6b is a boundary on the fourth side surface 106d thereof in a plan view. A distance (a distance in a direction orthogonal to the central line α) between the boundary 6a and the boundary 6b is the smallest at the central position.

The second clad layer 108 is provided on the active layer 106. The second clad layer 108 is, for example, a second conductivity type (for example, a p-type) InGaAlP layer. Each of the clad layers 104 and 108 has a band gap larger than that of the active layer 106 and a refractive index smaller than that thereof. The clad layers 104 and 108 are provided with the active layer 106 interposed therebetween and have a function of minimizing leakage of injected carriers (electrons and holes) and light.

The second clad layer 108 has a fifth side surface 108a connected to the first side surface 106a of the active layer 106, and a sixth side surface 108b connected to the second side surface 106b of the active layer 106. The second clad layer 108 is provided with a ridge portion 128 thicker than a remaining portion 118 of the second clad layer 108. The ridge portion 128 extends from the fifth side surface 108a to the sixth side surface 108b. A planar shape (a shape in a plan view) of the ridge portion 128 is the same as, for example, a planar shape of the light waveguide 160.

In the light emitting device 100, a pin diode is constituted of the p-type second clad layer 108, the active layer 106 with which impurities are not doped, and the n-type first clad layer 104. In the light emitting device 100, if a forward bias voltage of the pin diode is applied (a current is injected) between the electrodes 120 and 122, recombination between electrons and holes occurs in the light waveguide 160. This recombination causes light to be emitted. Chain inductive emission occurs due to the generated light, and thus the intensity of the light is amplified in the light waveguide 160. The light waveguide 160 is constituted of the active layer 106 through which the light is guided, and the clad layers 104 and 108 which minimize leakage of the light.

The contact layer 110 is provided on the second clad layer 108. The contact layer 110 is provided between the ridge portion 128 and the second electrode 122. A planar shape of the contact layer 110 is the same as, for example, a planar shape of the ridge portion 128. The contact layer 110 is, for example, a p-type GaAs layer. The contact layer 110 is connected to (specifically, in ohmic contact with) the second electrode 122. The contact layer 110 is more conductive than the clad layers 104 and 108.

The contact layer 110 and the ridge portion 128 constitute the pillar shape portion 111. The light emitting device 100 is a refractive index waveguide type SLD. In a plan view, a planar shape of the light waveguide 160 is the same as, for example, a planar shape of the pillar shape portion 111.

The laminated body 101 constituted of the contact layer 110, the second clad layer 108, the active layer 106, the first clad layer 104, and the substrate 102 has a connection area 130 which is connected to the second electrode 122. In the illustrated example, the contact layer 110 is connected to the second electrode 122 in the connection area 130. The connection area 130 is a contact surface between the contact layer 110 and the second electrode 122, and the contact layer 110 has the connection area 130.

An outer edge 132 of the connection area 130 has a first portion 132a serving as an end portion of the first light emission surface 170 side, a second portion 132b serving as an end portion of the second light emission surface 172 side, a third portion 132c connecting one end of the first portion 132a to one end of the second portion 132b, and a fourth portion 132d connecting the other end of the first portion 132a to the other end of the second portion 132b.

The first portion 132a of the outer edge 132 is provided to be separated from the first side surface 106a of the active layer 106 in a plan view. The second portion 132b is provided to be separated from the second side surface 106b in a plan view. In the example illustrated in FIG. 1, the portions 132a and 132b are linear.

The third portion 132c of the outer edge 132 is provided on the third side surface 106c side of the active layer 106 in a plan view. The fourth portion 132d is provided on the fourth side surface 106d side in a plan view. In a plan view, the third portion 132c and the fourth portion 132d are smooth. In other words, the portions 132c and 132d do not have corners. In the illustrated example, the portions 132c and 132d are curved.

The connection area 130 has a point symmetric shape with respect to the central position C in a plan view. Consequently, for example, it is possible to reduce a difference between the intensity of light emitted from the first light emission surface 170 and the intensity of light emitted from the second light emission surface 172.

In a plan view, a width W of the connection area 130 is smallest at the central position C, and increases toward the end portions (in the illustrated example, the light emission surfaces 170 and 172) sides of the light waveguide 160 in the extending direction from the central position C. The width W monotonously increases toward the end portions of the light waveguide 160 in the extending direction from the central position C. Here, the width W is a size in a direction (the direction of the central line α) orthogonal to the extending direction of the light waveguide 160, and is a distance between the third portion 132c and the fourth portion 132d. In the illustrated example, the width W is largest at the first portion 132a and the second portion 132b.

The connection area 130 may have a shape obtained by excluding a first ellipse (not illustrated) having a focus on a straight line QR (not illustrated) and a second ellipse (not illustrated) having a focus on a straight line ST (not illustrated) from a rectangular shape formed by the straight line (line segment) QR connecting intersections Q and R to each other, the straight line (line segment) ST connecting intersections S and T to each other, and the portions of 132a and 132b of the outer edge 132. The connection area 130 may have a shape obtained by excluding a third ellipse (not illustrated) which has a focus further toward the third side surface 106c of the active layer 106 than the straight line QR and has a curve passing through the intersections Q and R, and a fourth ellipse (not illustrated) which has a focus further toward the fourth side surface 106d side than the straight line ST and has a curve passing through the intersections S and T, from the rectangular shape formed by the straight lines QR and ST, and the portions 132a and 132b. Although not illustrated, as long as the portions 132c and 132d are smooth, parts thereof may be linear.

The intersection Q is an intersection between the first portion 132a and the third portion 132c of the outer edge 132. The intersection R is an intersection between the second portion 132b and the third portion 132c. The intersection S is an intersection between the first portion 132a and the fourth portion 132d. The intersection T is an intersection between the second portion 132b and the fourth portion 132d.

The width W of the connection area 130 increases toward the end portions (illustrated example, the light emission surfaces 170 and 172) of the light waveguide 160 in the extending direction from the central position C in proportion to an exponential function. For example, the width W increases in proportion to an exponential function obtained through a sum of the following Equations (1) and (2).

$$P^+(z)=|A^+|^2\exp(+\alpha_{mir}z) \tag{1}$$

$$P^-(z)=|A^-|^2\exp(-\alpha_{mir}z) \tag{2}$$

Here, in Equations (1) and (2), $A^+$ and $A^-$ satisfy relationships of the following Equations (3) to (8).

$$E(x,y,z)=E(x,y)[A^+\exp(+i\tilde{\beta}z)+A^-\exp(-i\tilde{\beta}z)] \quad (0<z<\xi) \tag{3}$$

$$E(x,y,z)=E(x,y)[B^+\exp(+i\tilde{\beta}z)+B^-\exp(-i\tilde{\beta}z)] \quad (\xi<z<L) \tag{4}$$

$$A^+=\sqrt{R_b}A^- \tag{5}$$

$$B^-\exp(-i\tilde{\beta}L)=\sqrt{R_f}B^+\exp(+i\tilde{\beta}L) \tag{6}$$

$$A^+\exp(+i\tilde{\beta}\xi)+ad\xi=B^+\exp(+i\tilde{\beta}\xi) \tag{7}$$

$$A^-=B^- \tag{8}$$

Equations (1) to (8) are relational expressions for a light wave of a waveguide type Fabry-Perot (FP) resonator. Hereinafter, details thereof will be described below.

A case is assumed in which a light wave is not externally input to the waveguide type FP resonator, but there is a minute light source at a position of z=ξ in a waveguide, and thus a light wave with a single frequency ω which propagates in a+z direction. In this case, the light wave in the waveguide may be expressed by Equations (3) and (4). Boundary conditions at both ends (z=0 and L) and z=ξ in the waveguide may be expressed by Equations (5) to (8). From the above equations, $A^+$, $A^-$, $B^+$, and $B^-$ can be obtained.

Here, in the above equations, i indicates a complex number; "~" on β indicates a complex propagation constant; $R_b$ and $R_f$ respectively indicate power refractive indexes of left and right mirrors; and adξ indicates the amplitude of the minute light source.

In the waveguide type FP resonator, in Equations (1) and (2), $\alpha_{mir}$ is mirror loss indicating the extent of attenuation of power due to some of the power leaking out of the resonator during mirror reflection, and has a form expressed as an attenuation coefficient obtained by averaging, with a path length 2L of a single round trip, light wave power which becomes $R_fR_b$ times through reflection in the single round trip. $\alpha_{mir}$ may be expressed as in the following Equation (9). The SLD can increase $\alpha_{mir}$.

$$\alpha_{mir}=(1/2L)\ln(1/R_fR_b) \quad (9)$$

In the waveguide type FP resonator, Equation (1) indicates the intensity (power) of light emitted from one end portion, and Equation (2) indicates the power of light emitted from the other end portion. The width W increases toward the end portion sides of the light waveguide 160 in the extending direction, for example, from the central position C in proportion to an exponential function of a sum of Equations (1) and (2).

The width W of the connection area 130 may increase toward the end portions (illustrated example, the light emission surfaces 170 and 172) of the light waveguide 160 in the extending direction from the central position C in proportion to a quadratic or higher-order function.

The insulating layer 112 is provided on the second clad layer 108, the lateral sides of the pillar shape portion 111 (the periphery of the pillar shape portion 111 in a plan view), and a part of the top of the pillar shape portion 111. In the illustrated example, a planar shape of the connection area 130 is determined depending on a planar shape of an opening of the insulating layer 112 provided on the pillar shape portion 111. The insulating layer 112 is, for example, a SiN layer, a $SiO_2$ layer, a SiON layer, an $Al_2O_3$ layer, or a polyimide layer. In a case where the above-described material is used as the insulating layer 112, a current between the electrodes 120 and 122 avoids the insulating layer 112 and flows through the pillar shape portion 111 located between the insulating layers 112. The insulating layer 112 has a refractive index lower than, for example, a refractive index of the second clad layer 108.

The first electrode 120 is provided under the substrate 102. The first electrode 120 is provided on a lower surface of a layer (the substrate 102 in the illustrated example) which is in ohmic contact with the first electrode 120. The first electrode 120 is one electrode for driving (for injecting a current into the active layer 106) the light emitting device 100. As the first electrode 120, for example, an electrode is used in which a Cr layer, a AuGe layer, a Ni layer, and a Au layer are laminated in this order from the first clad layer 104 side.

The second electrode 122 is provided over the ridge portion 128. Specifically, the second electrode 122 is provided on the contact layer 110 and the insulating layer 112. The second electrode 122 is the other electrode for driving (for injecting a current into the active layer 106) the light emitting device 100. As the second electrode 122, for example, an electrode is used in which a Cr layer, a AuZn layer, and a Au layer are laminated in this order from the contact layer 110 side.

Although not illustrated, the second electrode 122 may not be provided near and above the side surfaces 106a and 106b of the active layer 106. Consequently, the side surfaces 106a and 106b can be easily formed through cleavage. For example, the second electrode 122 may be provided on only the connection area 130.

In the above description, the AlGaInP-based light emitting device 100 has been described, but all materials may be used which can form a light emitting device and a light waveguide according to an embodiment of the invention. Regarding semiconductor materials, for example, AlGaN-based, GaN-based, InGaN-based, GaAs-based, AlGaAs-based, InGaAs-based, InGaAsP-based, InP-based, GaP-based, AlGaP-based, and ZnCdSe-based semiconductor materials may be used.

In the above description, the light emitting device 100 has been described as a so-called refractive index waveguide type device in which a refractive index difference is provided between the area in which the pillar shape portion 111 is formed and the area in which the pillar shape portion 111 is not formed, and light is confined therebetween. Although not illustrated, a light emitting device according to the embodiment of the invention may be a so-called gain waveguide type device in which the light waveguide 160 generated by injecting a current is used as a waveguide area as it is without providing a refractive index difference through formation of the pillar shape portion 111.

The light emitting device 100 is applicable to light sources of, for example, a projector, a display, a lighting apparatus, and a measurement apparatus.

The light emitting device 100 has the following features, for example.

In the light emitting device 100, in a plan view, the width W of the connection area 130 is smallest at the central position C where respective distances to the first light emission surface 170 and the second light emission surface 172 are the same as each other, and increases toward the end portion sides of the light waveguide 160 in the extending direction. Consequently, in the light emitting device 100, it is possible to reduce gain saturation and thus to achieve high output. Hereinafter, the reason thereof will be described.

Figure 4:
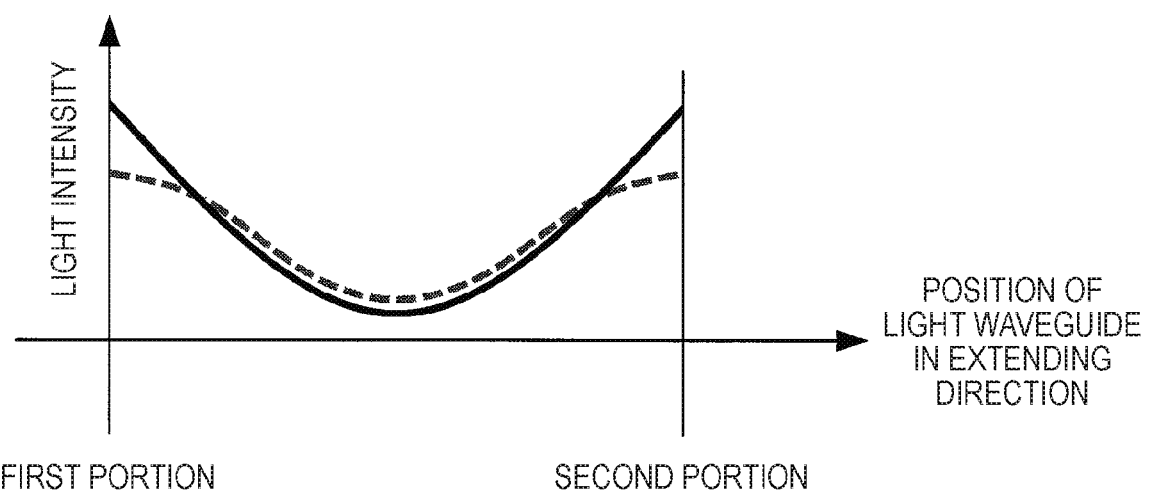
FIG. 4 is a diagram for explaining a relationship between a position of the light waveguide in the extending direction and light intensity.

FIG. 4 is a diagram for explaining a relationship between a position of the light waveguide 160 in the extending direction (propagation direction) and light intensity. The position of the light waveguide 160 in the extending direction expressed by the transverse axis of FIG. 4 indicates a position of the light waveguide 160 in the extending direction between a position overlapping the first portion 132a of the outer edge 132 of the connection area 130 and a position overlapping the second portion 132b of the outer edge 132 in a plan view. The light intensity expressed by the longitudinal axis of FIG. 4 indicates the number of photons passing through a section which is perpendicular to the extending direction of the light waveguide 160 per unit time at a position of the light waveguide 160 in the extending direction.

In the SLD, light is exponentially amplified toward a light emission surface (a surface having a lower refractive index).

For this reason, as illustrated in FIG. 4, the light intensity has a nonuniform distribution in the extending direction of the light waveguide. Thus, in a case where the current amount per unit length is constant in the extending direction of the light waveguide, carriers become insufficient relative to light (relative to photons) in the vicinity of the light emission surface. In other words, when the light is about to be amplified, carriers converted into the light becomes insufficient. As a result, gain saturation occurs on the light emission surface side with great light intensity, and, accordingly, light output is reduced (refer to the dashed line in FIG. 4).

The current amount per unit length is an amount of current which flows through a portion at a certain position of the light waveguide 160 in the extending direction, in the stacking direction (the stacking direction of the active layer 106 and the first clad layer 104). In other words, the current amount per unit length corresponds to the width W of the connection area 130.

A portion (for example, the central position C) with small light intensity is in a state in which there are more carriers than in the vicinity of the light emission surface, and the carriers are not sufficiently converted into light and thus remain therein. Therefore, a current for generating such remaining carriers is injected into the light emission surface side on which carriers are insufficient, and thus it is possible to perform driving with high efficiency while achieving high output. In other words, it is possible to reduce the gain saturation and thus to increase final light output while maintaining an amount of a current injected into the entire light waveguide to be constant by changing the current amount per unit length.

In the light emitting device 100, as described above, since the width W of the connection area 130 is smallest at the central position C, and increases toward the end portion sides of the light waveguide 160 in the extending direction, the current amount per unit length of the light waveguide 160 overlapping the connection area 130 can be increased toward the end portion sides of the light waveguide 160 in the extending direction from the central position C in a plan view. Therefore, in the light emitting device 100, it is possible to prevent light output from being reduced due to the gain saturation without increasing an amount of current injected into the entire light waveguide 160. In other words, in the light emitting device 100, it is possible to reduce the gain saturation and thus to achieve high output.

In the light emitting device 100, in a plan view, the third portion 132c and the fourth portion 132d of the outer edge 132 of the connection area 130 are smooth. Thus, in the light emitting device 100, it is possible to more easily form the connection area 130 than in a case where corners are formed at the third portion 132c and the fourth portion 132d of the outer edge 132. For example, in a case where the connection area 130 is patterned by using a photolithography technique and an etching technique, if corners are to be formed at the third portion 132c and the fourth portion 132d of the outer edge 132, an exposure condition is required to be accurately adjusted, and thus the connection area 130 may not be easily formed.

In the light emitting device 100, the width W of the connection area 130 increases toward the end portion sides of the light waveguide 160 in the extending direction from the central position C in proportion to an exponential function in a plan view. Thus, in the light emitting device 100, the current amount per unit length can be changed in accordance with light being exponentially magnified in the extending direction of the light waveguide 160. Therefore, it is possible to efficiently achieve high output. Specifically, since an amount of light is increased toward the end portion sides of the light waveguide 160 in the extending direction from the central position C according to a sum of Equations (1) and (2) in a plan view, it is possible to achieve high output more efficiently by increasing the width W in proportion to an exponential function corresponding to the sum of Equations (1) and (2).

In the light emitting device 100, the light waveguide 160 extends in the tilted direction with respect to the normal line P1 of the first light emission surface 170 and the normal line P2 of the second light emission surface 172. For this reason, in the light emitting device 100, it is possible to prevent light generated in the light waveguide 160 from being directly reflected in a multiple manner between the light emission surfaces 170 and 172. Consequently, in the light emitting device 100, a direct resonator is not formed, and thus it is possible to prevent laser oscillation of light generated in the light waveguide 160. As a result, it is possible to reduce speckle noise in the light emitting device 100. The light emitting device 100 is an SLD.

In the light emitting device 100, the second clad layer 108 is provided with the ridge portion 128 thicker than the remaining portion 118 of the second clad layer 108. Thus, in the light emitting device 100, a refractive index difference is provided between the area in which the ridge portion 128 is formed and the area in which the ridge portion 128 is not formed, and thus light can be efficiently confined therebetween.

In the light emitting device 100, the laminated body 101 has the contact layer 110 provided between the second clad layer 108 and the second electrode 122. Thus, in the light emitting device 100, it is possible to reduce contact resistance between the laminated body 101 and the second electrode 122.

2. Manufacturing Method of Light Emitting Device

Figure 5:
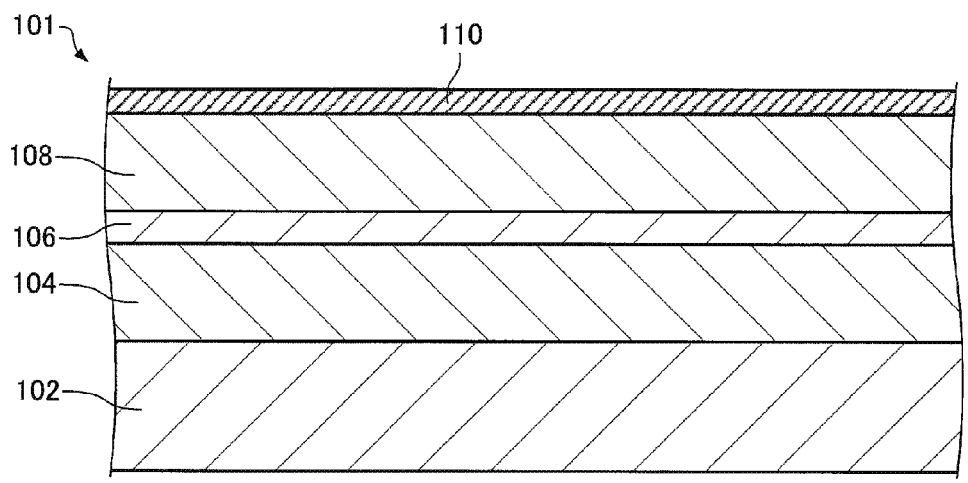
FIG. 5 is a sectional view schematically illustrating a manufacturing step of the light emitting device according to the present embodiment.
Figure 6:
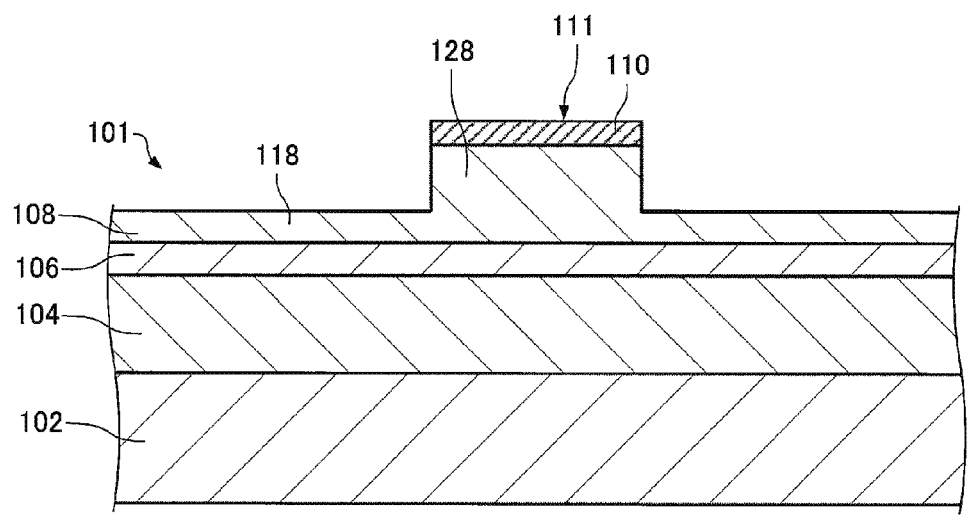
FIG. 6 is a sectional view schematically illustrating a manufacturing step of the light emitting device according to the present embodiment.

Next, a description will be made of a manufacturing method of the light emitting device 100 according to the present embodiment with reference to the drawings. FIGS. 5 and 6 are sectional views schematically illustrating manufacturing steps of the light emitting device 100 according to the present embodiment.

As illustrated in FIG. 5, the first clad layer 104, the active layer 106, the second clad layer 108, and the contact layer 110 are subject to epitaxial growth on the substrate 102 in this order. Consequently, the laminated body 101 is formed. As methods for the epitaxial growth, there may be, for example, a metal organic chemical vapor deposition (MOCVD) method, and a molecular beam epitaxy (MBE) method.

As illustrated in FIG. 6, the pillar shape portion 111 is formed by patterning the contact layer 110 and the second clad layer 108. The patterning is performed through, for example, photolithography and etching. The etching of the contact layer 110 and the second clad layer 108 may be performed simultaneously or separately.

As illustrated in FIG. 2, the insulating layer 112 is formed to cover the side surfaces of the pillar shape portion 111. Specifically, the insulating layer 112 is formed by forming an insulating member (not illustrated) according to a chemical vapor deposition (CVD) method (more specifically, a plasma CVD method) or a coating method and by patterning the insulating member. The patterning is performed through, for example, photolithography and etching.

Next, the second electrode 122 is formed on the contact layer 110. Next, the first electrode 120 is formed on the lower surface of the substrate 102. The electrodes 120 and 122 are formed according to, for example, a vapor deposition method or a sputtering method. An order of forming the electrodes 120 and 122 is not particularly limited.

The light emitting device 100 can be manufactured through the above-described steps.

3. Modification Examples of Light Emitting Device

3.1. Modification Example 1

Figure 7:
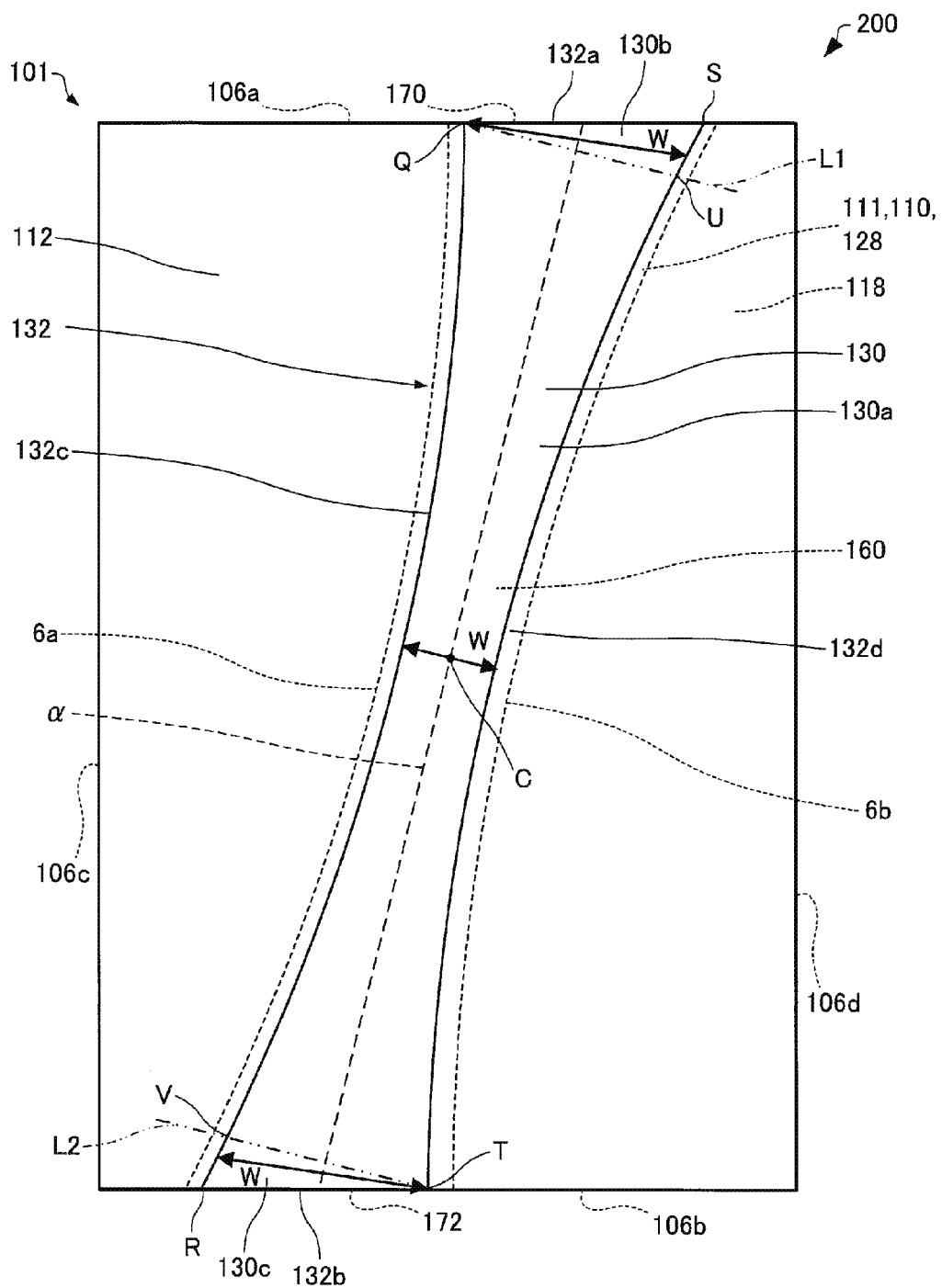
FIG. 7 is a plan view schematically illustrating a light emitting device according to Modification Example 1 of the present embodiment.

Next, a description will be made of a light emitting device according to Modification Example 1 of the present embodiment with reference to the drawings. FIG. 7 is a plan view schematically illustrating a light emitting device 200 according to Modification Example 1 of the present embodiment. For convenience, the second electrode 122 is not illustrated in FIG. 7.

Hereinafter, in the light emitting device 200 according to Modification Example 1 of the present embodiment, members having the same functions as the constituent members of the light emitting device 100 according to the present embodiment are given the same reference numerals, and detailed description thereof will be omitted. This is also the same for light emitting devices according to Modification Examples 2 and 3 to be described later of the present embodiment.

In the above-described light emitting device 100, as illustrated in FIG. 1, the connection area 130 is separated from the side surfaces 106a and 106b of the active layer 106 in a plan view. In contrast, in the light emitting device 200, as illustrated in FIG. 7, the connection area 130 is provided from the first side surface 106a to the second side surface 106b in a plan view.

In the light emitting device 200, in a plan view, the first portion 132a of the outer edge 132 overlaps the first side surface 106a of the active layer 106, and the second portion 132b overlaps the second side surface 106b. In other words, the first portion 132a is located over the first side surface 106a, and the second portion 132b is located over the second side surface 106b.

As illustrated in FIG. 7, the connection area 130 has a first area 130a, a second area 130b, and a third area 130c. Here, an intersection between a virtual straight line L1 which passes through the intersection Q and is orthogonal to the central line α, and the fourth portion 132d of the outer edge 132, is indicated by U. An intersection between a virtual straight line L2 which passes through the intersection T and is orthogonal to the central line α, and the third portion 132c of the outer edge 132 is indicated by V. The first area 130a is a area surrounded by a line segment QU, a part of the third portion 132c from the intersection Q to the intersection V, a line segment TV, and a part of the fourth portion 132d from the intersection T to the intersection U. The second area 130b is a area surrounded by the line segment QU, a part of the fourth portion 132d from the intersection U to the intersection S, and the first portion 132a. The third area 130c is a area surrounded by the line segment TV, a part of the third portion 132c from the intersection V to the intersection R, and the second portion 132b.

Here, in a case where a straight line (orthogonal straight line) which passes through the third portion 132c and the fourth portion 132d of the outer edge 132 and is orthogonal to the central line α is drawn as in the connection area 130 of the light emitting device 100 illustrated in FIG. 1 or the first area 130a of the connection area 130 of the light emitting device 200 illustrated in FIG. 7, a width W (at a certain position of the light waveguide 160 in the extending direction) of the connection area 130 is a distance of the orthogonal straight line between the third portion 132c and the fourth portion 132d. On the other hand, in a case where the orthogonal straight line which passes through the third portion 132c and the fourth portion 132d of the outer edge 132 and is orthogonal to the central line α is not drawn as in the second area 130b or the third area 130c of the connection area 130 illustrated in FIG. 7, the width W of the connection area 130 is a length of a straight line (line segment) drawn from the intersection Q to the fourth portion 132d in the second area 130b, and is a length of a straight line (line segment) drawn from the intersection T to the third portion 132c in the third area 130c.

The width W of the first area 130a of the connection area 130 increases toward the end portions of the light waveguide 160 in the extending direction from the central position C in a plan view in the same manner as the width W of the connection area 130 of the light emitting device 100. The width W of the second area 130b and the third area 130c also increases toward the end portions of the light waveguide 160 in the extending direction from the central position C.

The width W of the first area 130a of the connection area 130 may increase toward the end portions of the light waveguide 160 in the extending direction from the central position C in proportion to an exponential function in a plan view in the same manner as the width W of the connection area 130 of the light emitting device 100.

In the light emitting device 200, the current amount per unit length of the light waveguide 160 overlapping the first area 130a of the connection area 130 can be increased toward the end portion sides of the light waveguide 160 in the extending direction from the central position C in a plan view in the same manner as in the light emitting device 100. Therefore, in the light emitting device 200, it is possible to reduce the gain saturation and thus to achieve high output.

In the light emitting device 200, since the connection area 130 has the second area 130b and the third area 130c, it is possible to increase a larger amount of current injected into portions close to the light emission surfaces 170 and 172 of the light waveguide 160 than, for example, in a case where the connection area 130 is separated from the side surfaces 106a and 106b of the active layer 106. Thus, in the light emitting device 200, it is possible to achieve higher output.

3.2. Modification Example 2

Figure 8:
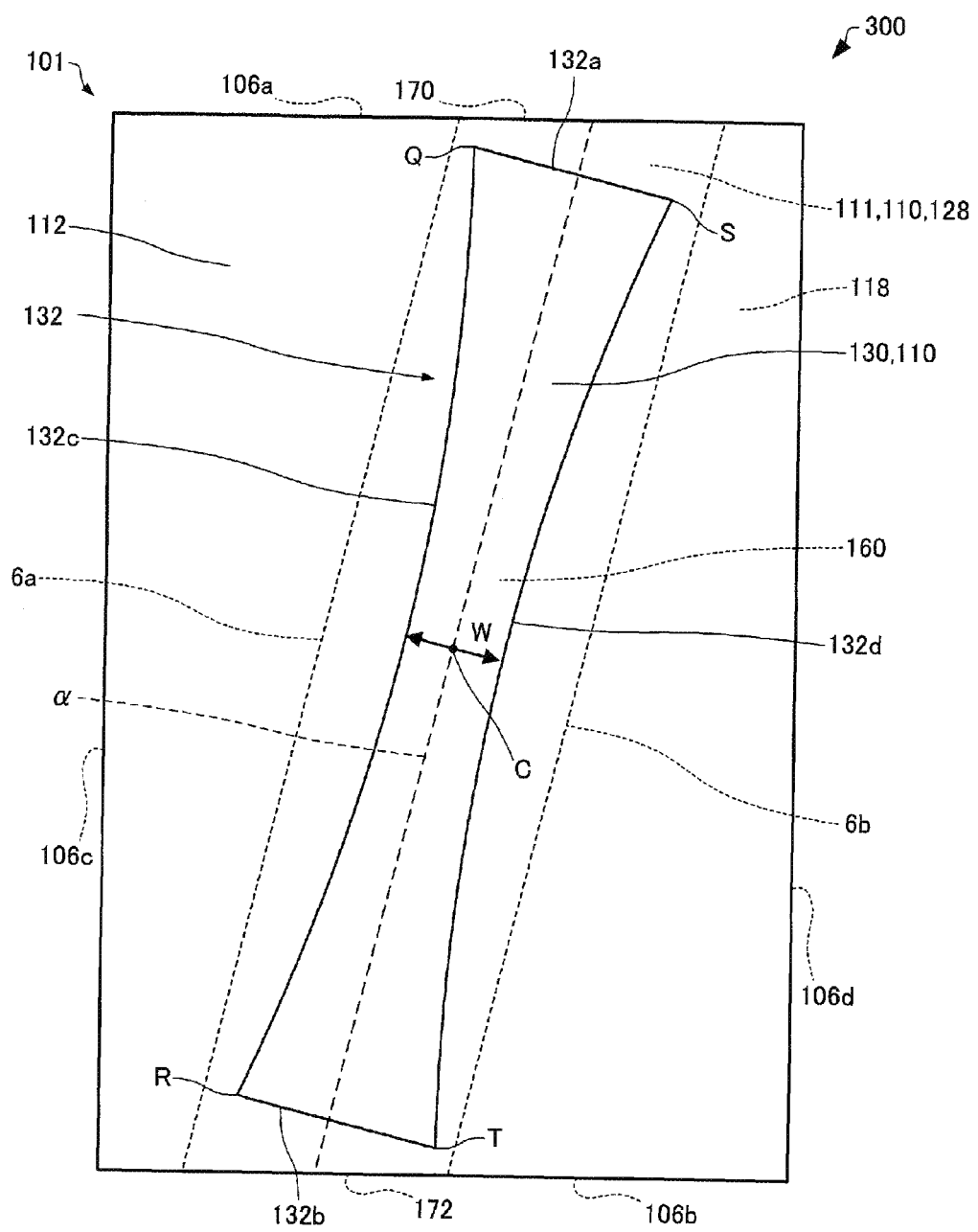
FIG. 8 is a plan view schematically illustrating a light emitting device according to Modification Example 2 of the present embodiment.

Next, a description will be made of a light emitting device according to Modification Example 2 of the present embodiment with reference to the drawings. FIG. 8 is a plan view schematically illustrating a light emitting device 300 according to Modification Example 2 of the present embodiment. For convenience, the second electrode 122 is not illustrated in FIG. 8.

In the above-described light emitting device 100, as illustrated in FIG. 1, the boundaries 6a and 6b of the light waveguide 160 are curved. In contrast, in the light emitting device 300, as illustrated in FIG. 8, the boundaries 6a and 6b of the light waveguide 160 are linear. In the example illustrated in FIG. 8, a planar shape of the light waveguide 160 is a parallelogramatic shape. In other words, a planar shape of the pillar shape portion 111 is a parallelogramatic shape.

In the light emitting device 300, it is possible to reduce the gain saturation and thus to achieve high output in the same manner as in the light emitting device 100.

In the light emitting device 300, although not illustrated, the connection area 130 may be provided from the first side surface 106a of the active layer 106 to the second side surface 106b thereof in the same manner as in the light emitting device 200 illustrated in FIG. 7.

3.3. Modification Example 3

Figure 9:
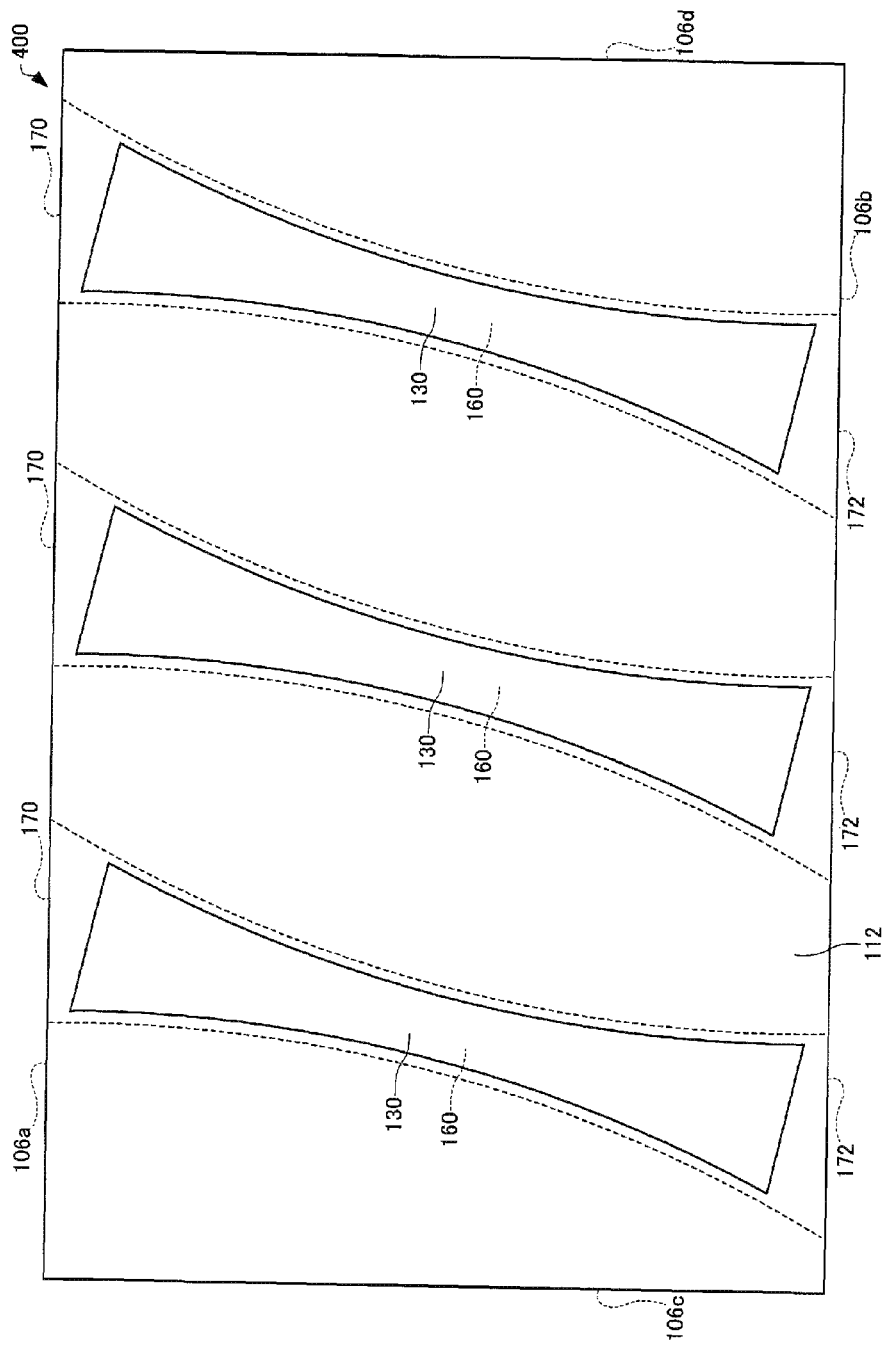
FIG. 9 is a plan view schematically illustrating a light emitting device according to Modification Example 3 of the present embodiment.

Next, a description will be made of a light emitting device according to Modification Example 3 of the present embodiment with reference to the drawings. FIG. 9 is a plan view schematically illustrating a light emitting device 400 according to Modification Example 3 of the present embodiment. For convenience, the second electrode 122 is not illustrated in FIG. 9.

The above-described light emitting device 100 has a single light waveguide 160 as illustrated in FIG. 1. In contrast, the light emitting device 400 has a plurality of light waveguides 160 as illustrated in FIG. 9. In the illustrated example, the light emitting device 400 has three light waveguides 160. The plurality of light waveguides 160 are arranged in a direction from the third side surface 106c of the active layer 106 toward the fourth side surface 106d thereof in a plan view.

In the light emitting device 400, it is possible to reduce the gain saturation and thus to achieve high output in the same manner as in the light emitting device 100. In the light emitting device 400, a plurality of light emitting devices 160 are arranged, and thus it is possible to achieve higher output.

In the light emitting device 400, although not illustrated, the connection area 130 may be provided from the first side surface 106a of the active layer 106 to the second side surface 106b thereof in the same manner as in the light emitting device 200 illustrated in FIG. 7. In the light emitting device 400, the boundaries 6a and 6b of the light waveguide 160 may be linear in a plan view in the same manner as in the light emitting device 300 illustrated in FIG. 8.

4. Projector

Figure 10:
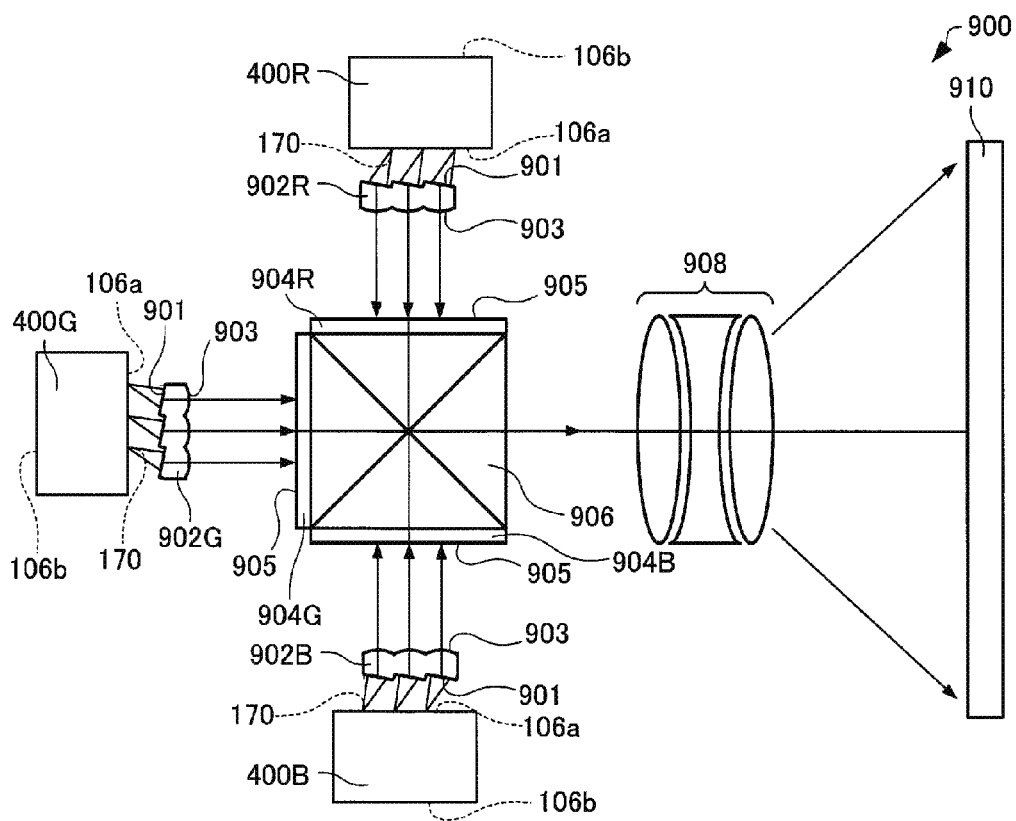
FIG. 10 is a diagram schematically illustrating a projector according to the present embodiment.

Next, a description will be made of a projector according to the present embodiment with reference to the drawing. FIG. 10 is a diagram schematically illustrating a projector 900 according to the present embodiment.

As illustrated in FIG. 10, the projector 900 includes a red light source 400R, a green light source 400G, and a blue light source 400B which respectively emit red light, green light, and blue light. The red light source 400R, the green light source 400G, and the blue light source 400B are light emitting devices according to the embodiment of the invention. Hereinafter, a description will be made of an example in which the light emitting device 400 is used as a light emitting device according to the embodiment of the invention. For convenience, in FIG. 10, a casing constituting the projector 900 is not illustrated, and the light sources 400R, 400G and 400B are simplified.

The projector 900 further includes lens arrays 902R, 902G and 902B, transmissive type liquid crystal light valves (light modulation devices) 904R, 904G and 904B, and a projection lens (projection device) 908.

Light beams emitted from the light sources 400R, 400G and 400B are respectively incident on the lens arrays 902R, 902G and 902B. Each of the lens arrays 902R, 902G and 902B has an incidence surface 901 on which light emitted from the first light emission surface 170 is incident, on each side of the light sources 400R, 400G and 400B. The incidence surface 901 is, for example, a flat surface. A plurality of incidence surfaces 901 are provided so as to correspond to a plurality of first light emission surfaces 170 and are disposed at the same intervals. A normal line (not illustrated) of the incidence surface 901 is tilted with respect to the first side surface 106a. The incidence surfaces 901 can cause optical axes of the light beams emitted from the first light emission surfaces 170 to be perpendicular to irradiation surfaces 905 of the liquid crystal light valves 904R, 904G and 904B.

Each of the lens arrays 902R, 902G and 902B has an emission surface 903 on each side of the liquid crystal light valves 904R, 904G and 904B. The emission surface 903 is, for example, a convex surface. A plurality of emission surfaces 903 are provided so as to correspond to the plurality of incidence surfaces 901 and are disposed at the same intervals. The light beams whose optical axes are converted in the incidence surfaces 901 may be collected via the emission surfaces 903 or may be superimposed (partially superimposed) by reducing diffusion angles thereof. Consequently, the liquid crystal light valves 904R, 904G and 904B can be uniformly irradiated.

As mentioned above, the lens arrays 902R, 902G and 902B can control the optical axes of the light beams emitted from the first light emission surfaces 170 and can collect the light beams.

The light beams collected by the lens arrays 902R, 902G and 902B are respectively incident on the liquid crystal light valves 904R, 904G and 904B. The respective liquid crystal light valves 904R, 904G and 904B modulate the incident light beams according to image information. The projection lens 908 enlarges images formed by the liquid crystal light valves 904R, 904G and 904B and projects the enlarged images onto a screen (display surface) 910.

The projector 900 may include a cross dichroic prism (color light combining device) 906 which combines light beams emitted from the liquid crystal light valves 904R, 904G and 904B and guides combined light to the projection lens 908.

Three color light beams modulated by the liquid crystal light valves 904R, 904G and 904B are incident on the cross dichroic prism 906. The prism is formed by joining four right-angle prisms to each other, and a dielectric multilayer film reflecting red light and a dielectric multilayer film reflecting blue light are disposed in a cross shape. The three color light beams are combined with each other by the dielectric multilayer films, and thus light exhibiting a color image is formed. The combined light is projected onto the screen 910 by the projection lens 908 which is a projection optical system, and thus an enlarged image is displayed.

In the example illustrated in FIG. 10, light emitted from the second light emission surface 172 provided on the second side surface 106b is not illustrated, but the light may be incident on a reflection portion and a lens array (not illustrated) and may then be incident on the liquid crystal light valves 904R, 904G and 904B.

The projector 900 may include the light emitting device 400 which can reduce the gain saturation and can achieve high output. For this reason, the projector 900 can achieve high luminance.

The projector 900 is of a type (backlight type) in which the light emitting device 400 is disposed directly under each of the liquid crystal light valves 904R, 904G and 904B, and both light collection and uniform illumination are performed by using the lens arrays 902R, 902G and 902B. Thus, in the projector 900, it is possible to reduce loss of the optical system and the number of components.

In the above-described example, the transmissive type liquid crystal light valves are used as light modulation devices, but light valves other than the liquid crystal light valves may be used, and reflective type light valves may be used. Such light valves may include, for example, reflective type liquid crystal light valves or digital micromirror devices. A configuration of the projection optical system is changed as appropriate depending on the type of light valve which is used.

The light sources 400R, 400G and 400B are applicable to light emitting devices of a scanning type image display apparatus (projector) including a scanning device as an image forming device which displays an image with a desired size on a display surface by scanning the screen with light from the light sources 400R, 400G and 400B.

Some configurations of the invention may be omitted or the embodiment and the respective modification examples may be combined with each other within the scope of achieving the features or the effects disclosed in the invention.

The invention includes substantially the same configuration (for example, a configuration in which functions, methods, and results are the same, or a configuration in which objects and effects are the same) as the configuration described in the embodiment. The invention includes a configuration in which an inessential part of the configuration described in the embodiment is replaced with another part. The invention includes a configuration which achieves the same operation and effect or a configuration capable of achieving the same object as in the configuration described in the embodiment. The invention includes a configuration in which a well-known technique is added to the configuration described in the embodiment.

The entire disclosure of Japanese Patent Application No. 2015-158760, filed Aug. 11, 2015 is expressly incorporated by reference herein.

What is claimed is:

1. A light emitting device comprising:
    a laminated body that has an active layer which can generate light with a current injected thereinto, and a first clad layer and a second clad layer interposing the active layer therebetween; and
    a first electrode and a second electrode that inject a current into the active layer,
    wherein the active layer constitutes a light waveguide through which light is guided,
    wherein the light waveguide has a first light emission surface and a second light emission surface from which light is emitted,
    wherein the laminated body has a connection area connected to the second electrode,
    wherein a width of the connection area is smallest at a central position where distances to the first light emission surface and the second light emission surface are the same as each other and increases toward end portion sides in an extending direction of the light waveguide, when viewed from a stacking direction of the active layer and the first clad layer,
    wherein an outer edge of the connection area, when viewed from the stacking direction, is provided with
    a first portion serving as an end portion on the first light emission surface side;
    a second portion serving as an end portion on the second light emission surface side;
    a third portion connecting one end of the first portion to one end of the second portion; and
    a fourth portion connecting the other end of the first portion to the other end of the second portion, and
    wherein the third portion and the fourth portion are smooth when viewed from the stacking direction.

2. The light emitting device according to claim 1,
    wherein, when viewed from the stacking direction, the width of the connection area increases toward the end portion sides from the central position in proportion to an exponential function.

3. The light emitting device according to claim 1,
    wherein the light waveguide extends in a tilted direction with respect to a normal line of the first light emission surface and a normal line of the second light emission surface.

4. The light emitting device according to claim 1,
    wherein the second clad layer has a ridge portion thicker than other portions of the second clad layer.

5. The light emitting device according to claim 1,
    wherein the laminated body has a contact layer provided between the second clad layer and the second electrode, and
    wherein the contact layer is connected to the second electrode.

6. The light emitting device according to claim 1,
    wherein the light waveguide is arranged in a plurality.

7. A projector comprising:
    the light emitting device according to claim 1;
    a light modulation device that modulates light emitted from the light emitting device according to image information; and
    a projection device that projects an image formed by the light modulation device.

8. A projector comprising:
    the light emitting device according to claim 2;
    a light modulation device that modulates light emitted from the light emitting device according to image information; and
    a projection device that projects an image formed by the light modulation device.

9. A projector comprising:
    the light emitting device according to claim 3;
    a light modulation device that modulates light emitted from the light emitting device according to image information; and
    a projection device that projects an image formed by the light modulation device.

10. A projector comprising:
    the light emitting device according to claim 4;
    a light modulation device that modulates light emitted from the light emitting device according to image information; and
    a projection device that projects an image formed by the light modulation device.

11. A projector comprising:
    the light emitting device according to claim 5;
    a light modulation device that modulates light emitted from the light emitting device according to image information; and
    a projection device that projects an image formed by the light modulation device.

12. A projector comprising:
    the light emitting device according to claim 6;
    a light modulation device that modulates light emitted from the light emitting device according to image information; and a projection device that projects an image formed by the light modulation device.

* * * * *